(12) United States Patent
Lee et al.

(10) Patent No.: US 8,879,268 B2
(45) Date of Patent: Nov. 4, 2014

(54) COOLING SYSTEM FOR AN ELECTRONIC RACK

(75) Inventors: Shih-Chang Lee, Taipei (TW); Chi-Hao Jin, Taipei (TW); Ming-Lee Chu, Taipei (TW); Chih-Hsun Lin, Taipei (TW)

(73) Assignee: Academia Sinica, Taipei (TW)

( * ) Notice: Subject to any disclaimer, the term of this patent is extended or adjusted under 35 U.S.C. 154(b) by 288 days.

(21) Appl. No.: 13/371,497

(22) Filed: Feb. 13, 2012

(65) Prior Publication Data
US 2012/0250259 A1    Oct. 4, 2012

(30) Foreign Application Priority Data

Apr. 1, 2011   (TW) .............................. 100205840 U

(51) Int. Cl.
H05K 7/20 (2006.01)
(52) U.S. Cl.
CPC .......... *H05K 7/20709* (2013.01); *H05K 7/2039* (2013.01); *H05K 7/20409* (2013.01); *H05K 7/20445* (2013.01); *H05K 7/20545* (2013.01)
USPC ........... 361/716; 361/704; 361/707; 361/714; 361/715; 361/724; 361/725; 361/726; 361/727
(58) Field of Classification Search
CPC .......... H05K 7/20709; H05K 7/20445; H05K 7/2039; H05K 7/20409; H05K 7/20545
USPC .................. 361/704, 707, 714–716, 724–727
See application file for complete search history.

(56) References Cited

U.S. PATENT DOCUMENTS

| | | | | |
|---|---|---|---|---|
| 3,971,186 A | * | 7/1976 | Havelka et al. ............. | 403/374.4 |
| 3,975,805 A | * | 8/1976 | Spurling et al. ............ | 403/374.3 |
| 4,994,937 A | * | 2/1991 | Morrison ...................... | 361/715 |
| 5,071,013 A | * | 12/1991 | Peterson ......................... | 211/26 |
| 5,290,122 A | * | 3/1994 | Hulme ....................... | 403/374.4 |
| 5,812,375 A | * | 9/1998 | Casperson .................... | 361/707 |
| 6,026,565 A | * | 2/2000 | Giannatto et al. .............. | 29/830 |
| 6,180,436 B1 | * | 1/2001 | Koors et al. ................... | 438/117 |
| 6,657,121 B2 | * | 12/2003 | Garner ......................... | 174/16.3 |
| 6,693,797 B2 | * | 2/2004 | Faneuf et al. ................. | 361/689 |
| 6,798,661 B1 | * | 9/2004 | Barsun et al. ................. | 361/700 |
| 7,403,384 B2 | * | 7/2008 | Pflueger ........................ | 361/688 |
| 7,643,309 B1 | * | 1/2010 | Lebo .............................. | 361/796 |
| 8,000,103 B2 | * | 8/2011 | Lipp et al. ..................... | 361/702 |
| 8,045,332 B2 | * | 10/2011 | Lee et al. ....................... | 361/759 |
| 8,289,710 B2 | * | 10/2012 | Spearing et al. .............. | 361/701 |
| 8,427,828 B2 | * | 4/2013 | Kehret et al. ............ | 361/679.54 |
| 8,477,498 B2 | * | 7/2013 | Porreca et al. ................ | 361/704 |
| 8,526,184 B2 | * | 9/2013 | Sullivan et al. ............... | 361/704 |
| 2003/0000721 A1 | * | 1/2003 | Garner ............................ | 174/50 |
| 2003/0051860 A1 | * | 3/2003 | Montgomery et al. ......... | 165/46 |

(Continued)

*Primary Examiner* — Anatoly Vortman
(74) *Attorney, Agent, or Firm* — Bacon & Thomas, PLLC

(57) ABSTRACT

The present invention discloses a cooling system for an electronic rack, comprising: an electronic rack comprising at least one side wall; at least one electronic chassis comprising a top wall and at least one side wall and disposed inside the electronic rack for housing at least one modular electronics equipment comprising a plurality of electronic components and at least one stationary thermal interface arranged above the plurality of electronic components; a first detachable thermal interface arranged between the top wall of the at least one electronic chassis and the at least one modular electronic equipment; and at least one second detachable thermal interface arranged between the at least one side wall of the electronic rack and the at least one side wall of the at least one electronic chassis.

11 Claims, 5 Drawing Sheets

(56) References Cited

U.S. PATENT DOCUMENTS

| | | | |
|---|---|---|---|
| 2003/0201902 A1* | 10/2003 | Post et al. | 340/693.5 |
| 2003/0223197 A1* | 12/2003 | Hulan et al. | 361/719 |
| 2004/0037045 A1* | 2/2004 | Phillips et al. | 361/719 |
| 2005/0013117 A1* | 1/2005 | Barsun et al. | 361/700 |
| 2007/0034360 A1* | 2/2007 | Hall | 165/104.33 |
| 2008/0084668 A1* | 4/2008 | Campbell et al. | 361/702 |
| 2008/0164008 A1* | 7/2008 | Austin et al. | 165/80.2 |
| 2008/0259566 A1* | 10/2008 | Fried | 361/699 |
| 2009/0159241 A1* | 6/2009 | Lipp et al. | 165/80.2 |
| 2010/0020514 A1* | 1/2010 | Lee et al. | 361/801 |
| 2011/0013359 A1* | 1/2011 | Goldrian et al. | 361/679.54 |
| 2011/0058335 A1* | 3/2011 | Sullivan et al. | 361/704 |
| 2011/0187188 A1* | 8/2011 | Yang | 307/31 |
| 2011/0267776 A1* | 11/2011 | Porreca et al. | 361/694 |
| 2012/0020017 A1* | 1/2012 | Kehret et al. | 361/679.54 |
| 2013/0077232 A1* | 3/2013 | Nordin et al. | 361/679.47 |

* cited by examiner

COOLING SYSTEM FOR AN ELECTRONIC RACK

BACKGROUND OF THE UTILITY MODEL

1. Field of the Utility Model

The creation relates to a cooling system, and more particularly, to a cooling system for an electronic rack.

2. Description of the Prior Art

FIG. 1 illustrates the thermal paths of a conventional cooling system 100 for an electronics rack, and the arrows denote the heat flows. Heat generated by heat sources 110 (electronic components equipped in the electronic equipment, e.g. IC or hard disk) is removed to the external environment 112 by the forced air circulation 111. Air is used as heat transfer media. For facilities like data centers, which house a lot of computer racks and associated components, an active cooling system 113 is needed in order to lower the temperature and increase the heat transfer capability of the circulated air. However, it is difficult to bring cold air into equipment effectively without fans and additional infrastructures.

An electronic rack can be filled easily by equipment with total power more 20 kilo-Watt today. The cooling infrastructure for such system requires very high air flow rate. It will take more area and power than electronic equipment. A good example is the energy efficiency of a data center. The common way to determine the energy efficiency of a data center is power usage effectiveness (PUE). This ratio is obtained with the total power delivered to the data center divided by the power used by equipment. The average PUE value of data centers is around 2. In other words, a data center with one Mega-Watt electronics equipment has to spend another Mega-Watt for the cooling system of the data center. Moreover, the conventional cooling system for an electronics rack is disadvantageous in that it is energy inefficient and causes enormous noises. The wear-out of moving parts of fans will also degrade the reliability of the overall system.

In view of the aforementioned disadvantages, the present creation provides a cooling system for an electronic rack characterized by no fans, low noises and low power consumption.

SUMMARY OF THE UTILITY MODEL

One object of the present creation is to provide a cooling system for an electronic rack characterized by no fans, low noises and low power consumption.

To achieve the aforementioned object, the present creation provides a cooling system for an electronic rack comprising: an electronic rack comprising at least one side wall; at least one electronic chassis comprising a top wall and at least one side wall and disposed inside the electronic rack for housing at least one modular electronic equipment comprising a plurality of electronic components and at least one stationary thermal interface arranged above the plurality of electronic components; a first detachable thermal interface arranged between the top wall of the at least one electronics chassis and the at least one modular electronic equipment; and at least one second detachable thermal interface arranged between the at least one side wall of the electronic rack and the at least one side wall of the at least one electronic chassis.

In the aforementioned cooling system for an electronic rack of the present creation, the first detachable thermal interface or the at least one second detachable thermal interface is made of material with high thermal conductivity.

In the aforementioned cooling system for an electronic rack of the present creation, the first detachable thermal interface or the at least one second detachable thermal interface is made of metallic material.

In the aforementioned cooling system for an electronic rack of the present creation, the first detachable thermal interface or the at least one second detachable thermal interface is a heat pipe.

In the aforementioned cooling system for an electronic rack of the present creation, the electronic rack is provided with no fans therein.

In the aforementioned cooling system for an electronic rack of the present creation, the first detachable thermal interface comprises a first contact portion, a second contact portion and a locking portion. The displacement of one of the first contact portion and the second contact portion with respect to the other is effected by actuating the locking portion.

In the aforementioned cooling system for an electronic rack of the present creation, the at least one second detachable thermal interface comprises a first contact portion, a second contact portion and a locking portion. The displacement of one of the first contact portion and the second contact portion with respect to the other is effected by actuating the locking portion.

To achieve the aforementioned object, the present creation provides another cooling system for an electronic rack comprising: an electronic rack comprising at least one side wall; at least one modular electronic equipment comprising a top wall, at least one side wall, a plurality of electronic components and at least one stationary thermal interface arranged between the upper portions of the plurality of electronic components and the top wall and disposed inside the electronic rack; and at least one detachable thermal interface arranged between the at least one side wall of the electronics rack and the at least one side wall of the at least one modular electronic equipment.

In the aforementioned cooling system for an electronics rack of the present creation, the at least one detachable thermal interface is made of material with high thermal conductivity.

In the aforementioned cooling system for an electronic rack of the present creation, the first detachable thermal interface or the at least one second detachable thermal interface is made of metallic material.

In the aforementioned cooling system for an electronic rack of the present creation, the at least one detachable thermal interface is a heat pipe.

In the aforementioned cooling system for an electronic rack of the present creation, the electronic rack is provided with no fans therein.

In the aforementioned cooling system for an electronic rack of the present creation, the at least one detachable thermal interface comprises a first contact portion, a second contact portion and a locking portion. The displacement of one of the first contact portion and the second contact portion with respect to the other is effected by actuating the locking portion.

In the cooling system for an electronic rack of the present creation, heat generated by heat sources in electronic equipment is effectively dissipated to the external environment by thermal conduction. Therefore, the present cooling system requires no fans and is characterized by low noises and low power consumption. The following detailed embodiments, appended drawings and claims will enable the reader to better understand other objects, features and advantages of the present creation.

BRIEF DESCRIPTION OF THE DRAWINGS

The following drawings and description will facilitate the understanding of the system and method of the present creation. Please refer to the description on the drawings for exemplary embodiments not detailed in the specification. Constituent components may have been magnified and not illustrated according to actual scale for purposes of pictorial clarity. The same components in different drawings are denoted by the same symbols.

DETAILED DESCRIPTION OF THE PREFERRED EMBODIMENTS

Figure 1:
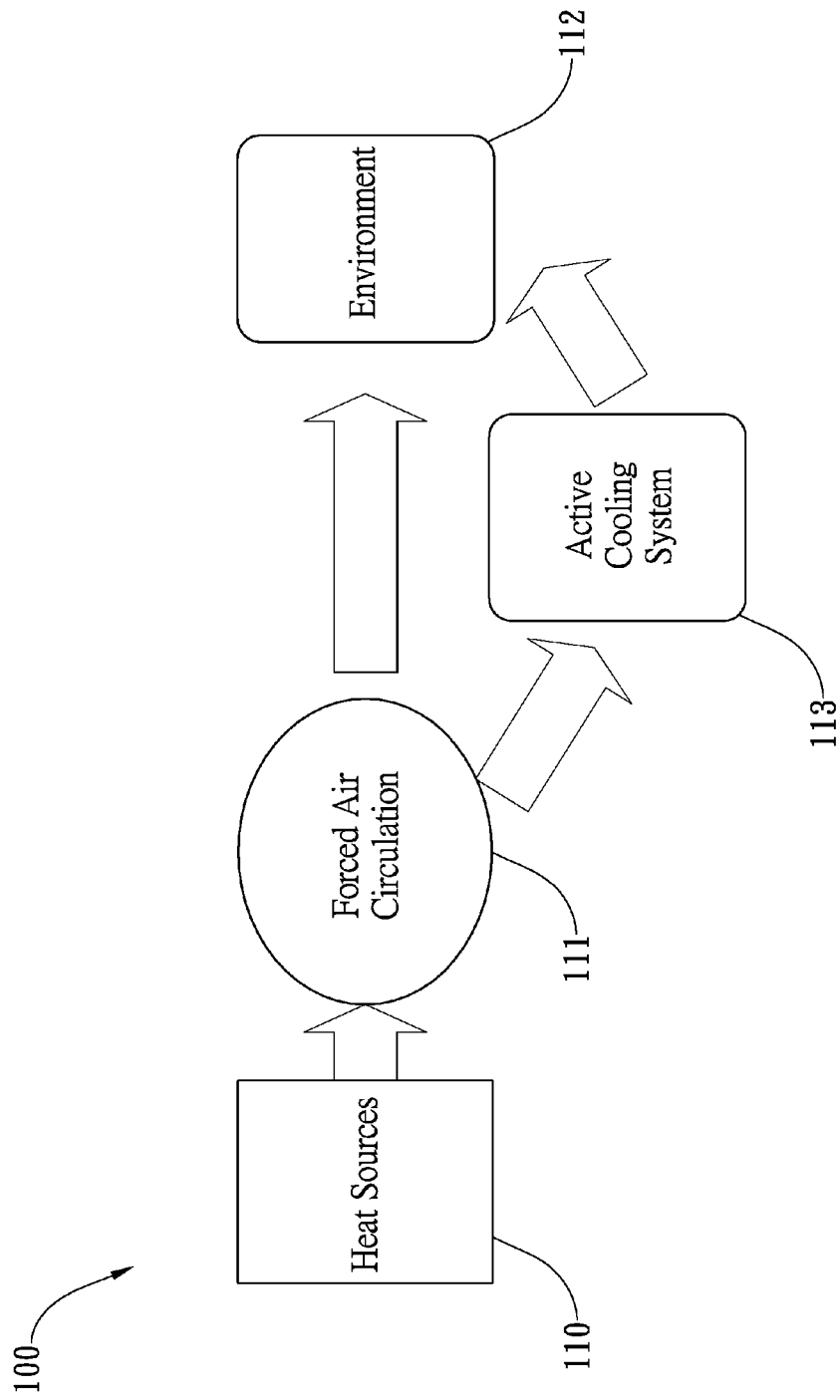
FIG. 1 is a diagram illustrating the thermal paths of a conventional cooling system 100 for an electronic rack.

The detailed embodiments of the present creation will be provided in the following paragraphs. It is to be noted that the embodiments of the present creation are exemplary. The present creation is not limited to the embodiments comprising specific features, structures or properties and the scope thereof is defined by the appended claims. In addition, the drawings do not specifically illustrate all unnecessary features of the present creation. For those illustrated in the drawings, they may be represented in simplified form or schematic manner. Furthermore, for the sake of clarity, the sizes of the components may be magnified in the drawings or not in actual proportion. Whether or not the components are simplified in form or the features are illustrated in detail, they fall within the scope of knowledge of the art so that they can be implemented by those skilled in the art in view of other embodiments related to the features, structures or properties.

Figure 2:
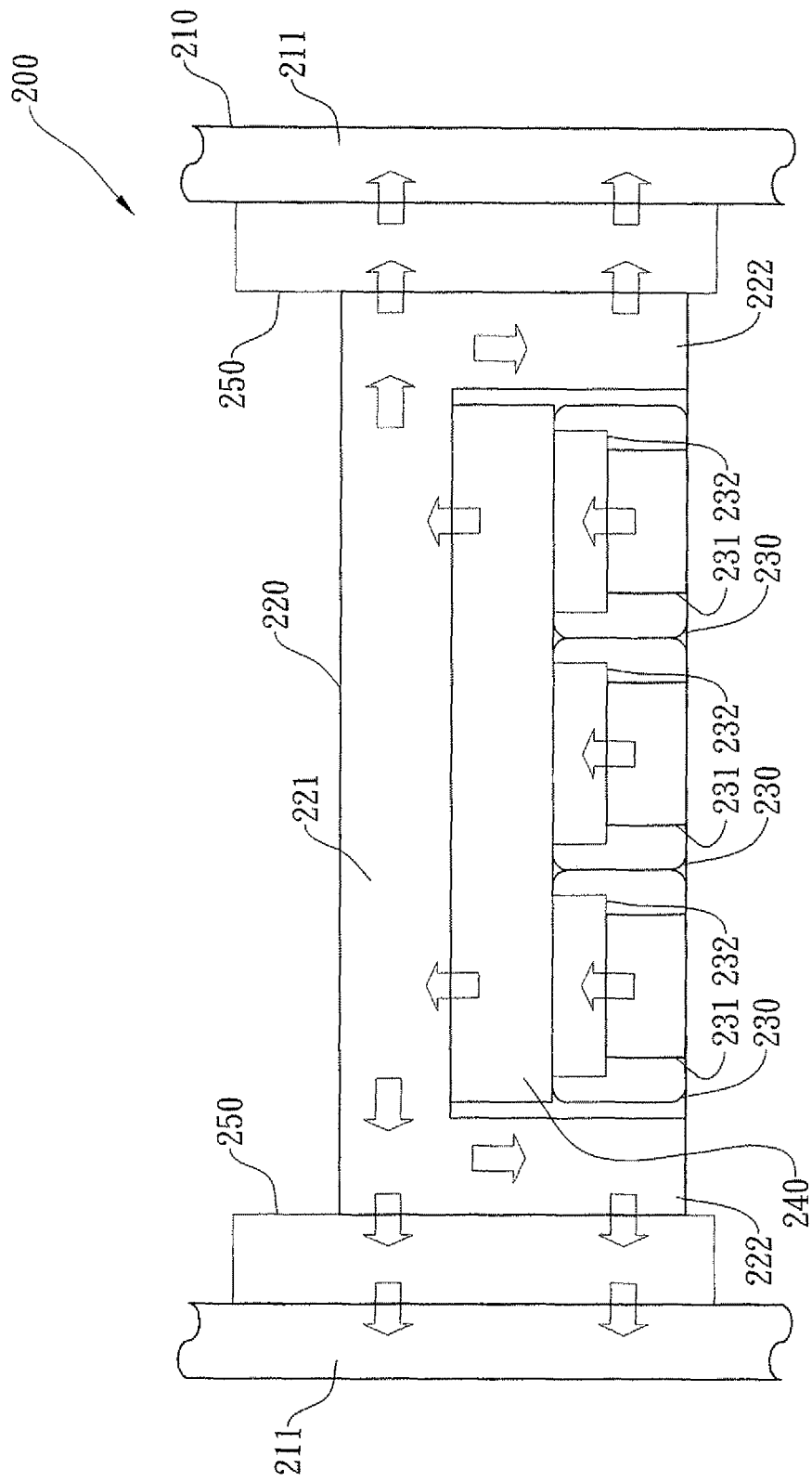
FIG. 2 is a partial view of a cooling system for an electronic rack in accordance with an embodiment of the present creation.

FIG. 2 is a partial view of a cooling system for an electronic rack in accordance with an embodiment of the present creation. The cooling system 200 for an electronic rack of the present creation comprises an electronic rack 210, a plurality of electronic chassis 220, a plurality of modular electronic equipment 230, a first detachable thermal interface 240 and a plurality of second detachable thermal interfaces 250. As the plurality of electronics chassis 220 of the cooling system 200 for an electronic rack are connected to the electronic rack 210 in the same manner, FIG. 2 only shows one electronic chassis 220. The electronic rack 210 comprises two side walls 211. The electronic chassis 220 comprises a top wall 221 and two side walls 222 and is disposed inside the electronics rack 210 for housing the plurality of modular electronics equipment 230. Each of the plurality of modular electronic equipment 230 comprises a plurality of electronic components 231 (e.g. IC, hard disk, etc.) and a stationary thermal interface 232 disposed above the plurality of electronic components 231. The first detachable thermal interface 240 is arranged between the top wall 221 of the electronic chassis 220 and the plurality of modular electronic equipment 230. The plurality of second detachable thermal interfaces 250 are arranged between the side walls 211 of the electronic rack 210 and the side walls 222 of the electronic chassis 220. The arrows in FIG. 2 indicate the heat flows, i.e. the thermal paths, in the cooling system 200 for an electronic rack. Heat generated by the electronic components 231 (e.g. IC, hard disk, etc.) in the plurality of electronic equipment 230 is conducted to the top wall 221 and the two side walls 222 of the electronic chassis 220 via the stationary thermal interface 232 and the first detachable thermal interface 240. The two side walls 211 of the electronic rack 210 then conduct the heat generated by the electronic components 231 in the plurality of electronic equipment 230 to the external environment from the top wall 221 and the two side walls 222 of the electronic chassis 220 via the plurality of second detachable thermal interfaces 250. The arrangement of thermal interfaces and large contact surfaces enables the cooling system 200 for an electronic rack to conduct and dissipate heat effectively without fans and air flows. In one embodiment of the present creation, the first detachable thermal interface 240 and the plurality of second detachable thermal interfaces 250 can be plates made by material with high thermal conductivity, heat pipes, or metallic plates.

Figure 3A:
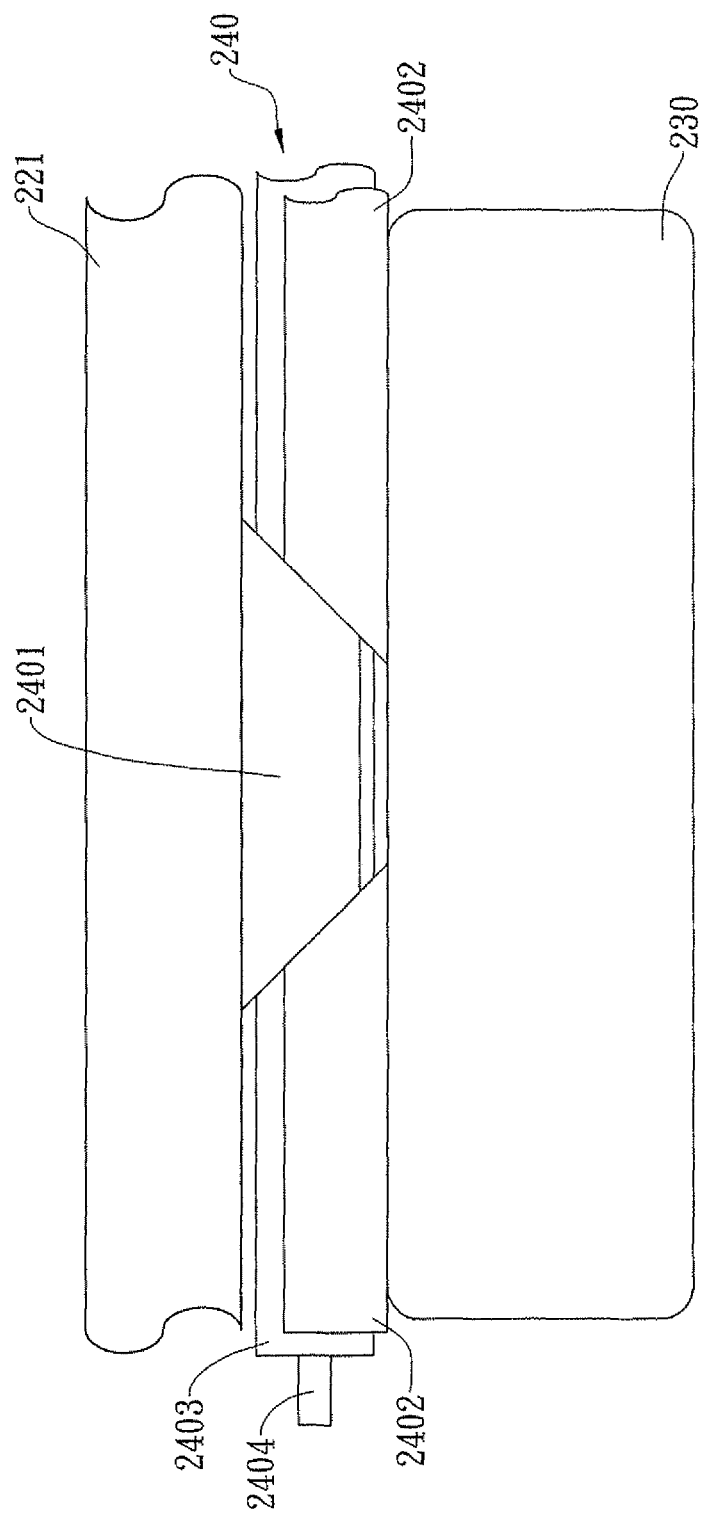
FIG. 3A is an enlarged view illustrating the modular electronic equipment, the first detachable thermal interface in the locked state and the top wall of the electronic chassis shown in FIG. 2.
Figure 3B:
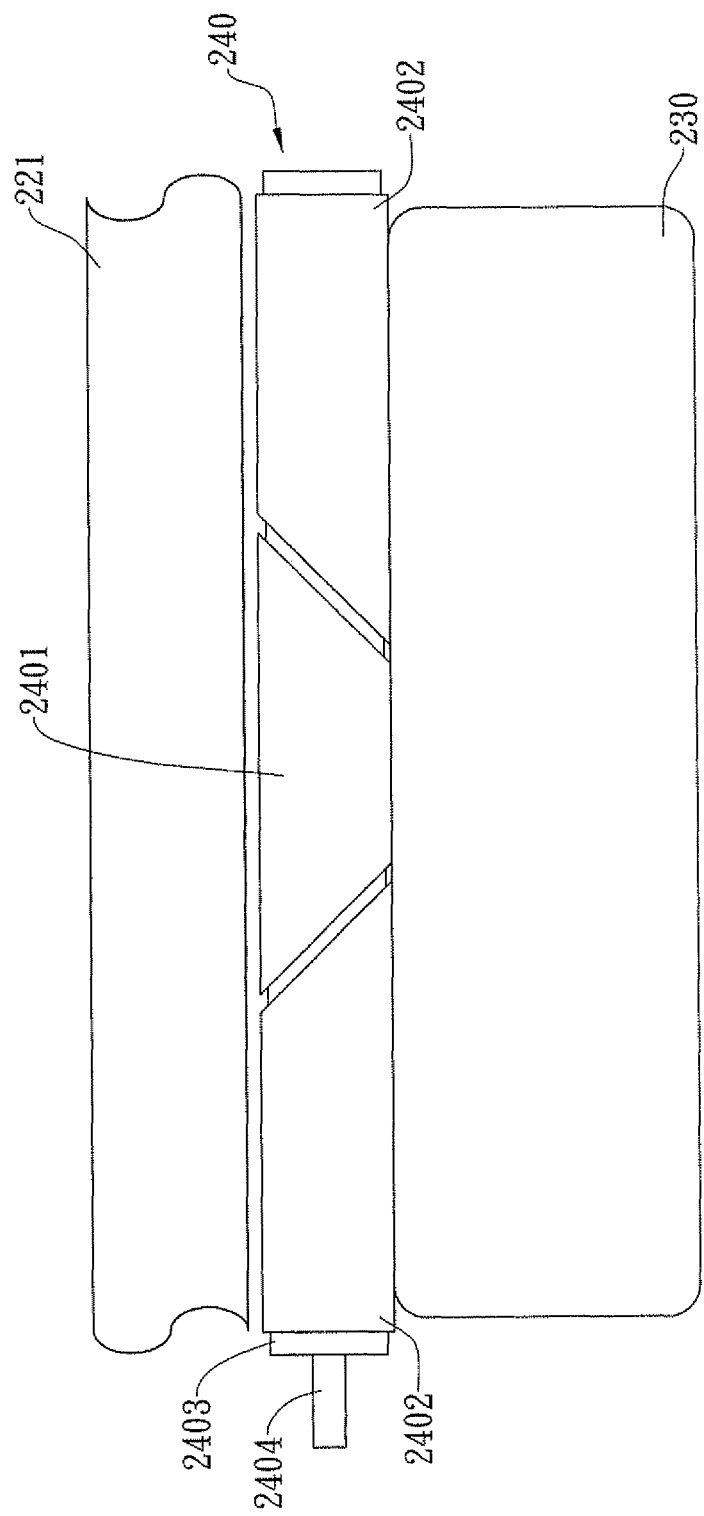
FIG. 3B is an enlarged view illustrating the modular electronic equipment, the first detachable thermal interface in the detached state, and the top wall of the electronic chassis shown in FIG. 2.

It is important that the modular electronic equipment or the electronic chassis is removable. Therefore, the structural design of the detachable thermal interface of the present creation enables the modular electronic equipment or the electronic chassis to be removed for replacement easily. FIGS. 3A and 3B are enlarged views illustrating the modular electronic equipment 230, the first detachable thermal interface 240 and the top wall 221 of the electronic chassis 220 shown in FIG. 2. Moreover, FIGS. 3A and 3B illustrate the first detachable thermal interface 240 in the locked state and the detached state, respectively. The first detachable thermal interface 240 comprises a first contact portion 2401, two second contact portions 2402, a main body 2403 and a locking portion 2404. The first contact portion 2401 and the second contact portion 2402 are wedge plates movably disposed on the main body 2403. FIG. 3A is a diagram illustrating the first detachable thermal interface 240 in the locked state. The fastening of the locking portion 2404 to the interior of the main body 2403 causes the second contact portions 2402 to move toward each other so as to push the first contact portion 2401 in the Z direction (i.e. a direction toward the top wall 221 of the electronics chassis 220). Consequently, the first contact portion 2401 is in close contact with the top wall 221 of the electronics chassis 220. Please also refer to FIG. 2. Heat generated by electronic components 231 (e.g. IC, hard disk, etc.) in the modular electronic equipment 230 can be conducted to the top wall 221 and the two side walls 222 of the electronics chassis 220 via the stationary thermal interfaces 232 and the first detachable thermal interface 240. FIG. 3B is a diagram illustrating the first detachable thermal interface 240 in the detached state. The detachment of the locking portion 2404 from the main body 2403 causes the separation of the second contact portions 2402. Consequently, the force that pushes the first contact portion 2401 in the Z direction (i.e. a direction toward the top wall 221 of the electronics chassis 220) disappears, and the first contact portion 2401 ceases to be in contact with the top wall 221 of the electronics chassis 220. Therefore, the modular electronic equipment 230 can be removed for replacement easily. Similarly, the structural design of the first detachable thermal interface 240 can be applied to the second detachable thermal interface 250 arranged between the side wall 211 of the electronics rack 210 and the side wall 222 of the electronic chassis 220.

Figure 4:
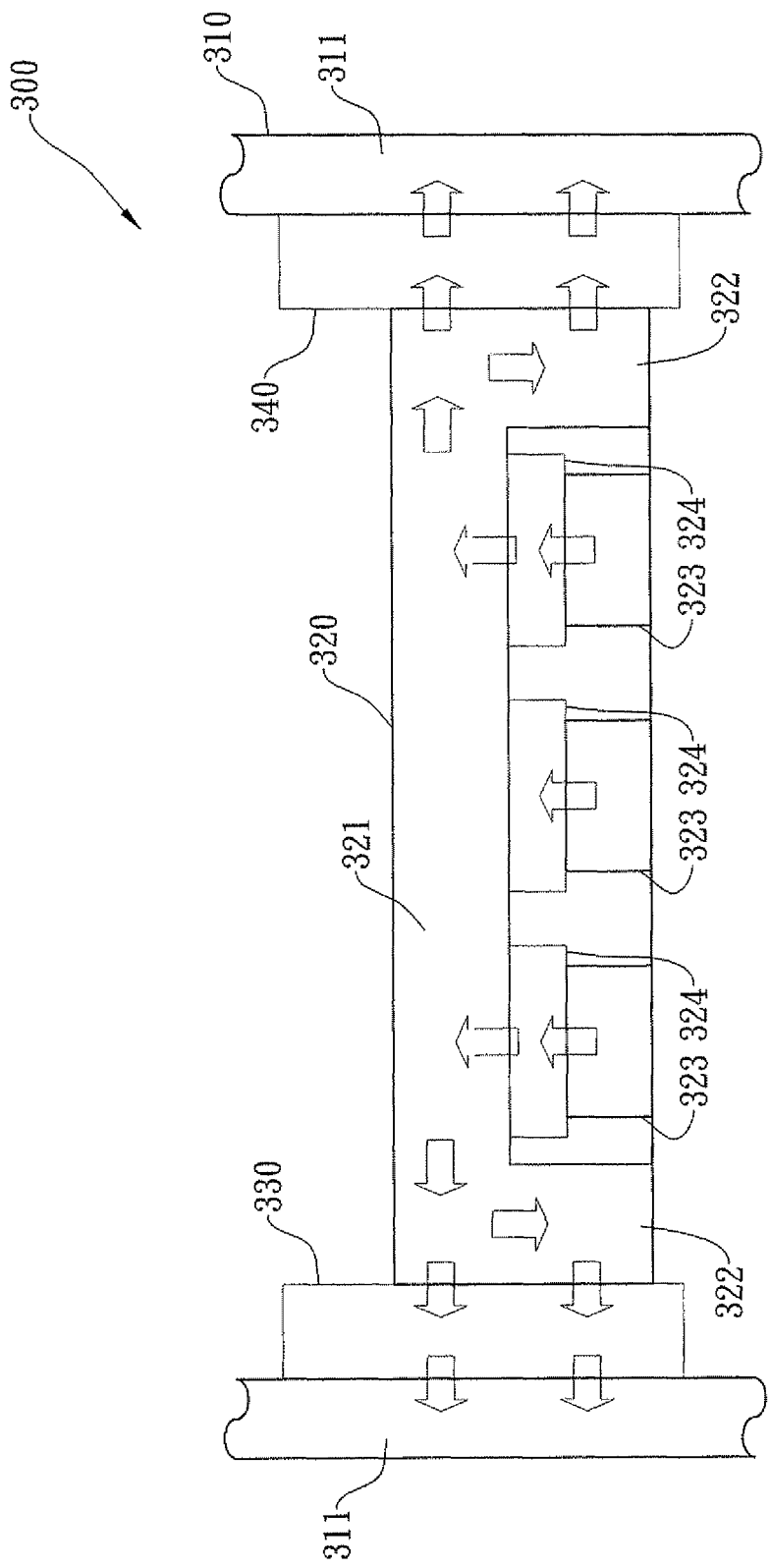
FIG. 4 is a partial view of a cooling system for an electronic rack in accordance with another embodiment of the present creation.

FIG. 4 is a partial view of a cooling system for an electronic rack in accordance with another embodiment of the present creation. The cooling system 300 for an electronic rack of the present creation comprises an electronic rack 310, a plurality of modular electronic equipment 320 and a plurality of detachable thermal interfaces 330. As the plurality of modular electronic equipment 320 of the cooling system 300 for an electronic rack are connected to the electronic rack 310 in the same manner, FIG. 4 only illustrates one modular electronic equipment 320. The electronic rack 310 comprises two side walls 311, and the modular electronic equipment 320 comprises a top wall 321 and two side walls 322. The modular electronic equipment 320 comprises a plurality of electronic components 323 (e.g. IC, hard drive, etc.) and a plurality of stationary thermal interfaces 324 arranged between the upper portions of the plurality of electronic components 323 and the top wall 321 and is disposed inside the electronic rack 310. The plurality of detachable thermal interfaces 330 are arranged between the side walls 311 of the electronic rack 310 and the side walls 322 of the modular electronic equipment 320. The arrows in FIG. 4 indicate the heat flows, i.e. the thermal paths, in the cooling system 300 for an electronic rack. Heat generated by the electronic components 323 (e.g. IC, hard disk, etc.) in the modular electronic equipment 320 is conducted to the top wall 321 and the two side walls 322 of the modular electronic equipment 320 via the plurality of stationary thermal interfaces 324. The two side walls 311 of the electronic rack 310 then conduct the heat generated by the electronic components 323 (e.g. IC, hard disk, etc.) to the external environment from the top wall 321 and the two side walls 322 of the modular electronic equipment 320 via the plurality of detachable thermal interfaces 330. The arrangement of thermal interfaces and large contact surfaces enables the cooling system 300 for an electronic rack to conduct and dissipate heat effectively without fans and air flows. In one embodiment of the present creation, the detachable thermal interface 330 may be a plate made by material with high thermal conductivity, a heat pipe, or a metallic plate and the structural design thereof can be the same as that of the first detachable thermal interface 240.

The spirit and scope of the present creation are not limited to the aforementioned embodiments. In addition, it will be understood that the drawings are merely schematic representations of the creation and not illustrated according to actual scale, and some of the components may have been magnified or simplified for purposes of pictorial clarity. The embodiments depicted above and the appended drawings are exemplary and are not intended to limit the scope of the present creation. The scope thereof is defined by the appended claims.

What is claimed is:

1. A cooling system for an electronic rack comprising:
   an electronic rack comprising at least one side wall;
   at least one electronic chassis comprising a top wall and at least one side wall and disposed inside the electronic rack for housing at least one modular electronic equipment comprising a plurality of electronic components and at least one stationary thermal interface arranged above the plurality of electronic components;
   a first detachable thermal interface arranged between the top wall of the electronic chassis and the at least one modular electronic equipment; and
   at least one second detachable thermal interface arranged between the at least one side wall of the electronic rack and the at least one side wall of the at least one electronic chassis,
   wherein the first detachable thermal interface comprises a first wedge plate, a second wedge plate and a locking portion, and a displacement of one of the first wedge plate and the second wedge plate with respect to the other is affected by actuating the locking portion.

2. The cooling system for an electronic rack according to claim 1, wherein the first detachable thermal interface or the at least one second detachable thermal interface is made of material with high thermal conductivity.

3. The cooling system for an electronics rack according to claim 1, wherein the first detachable thermal interface or the at least one second detachable thermal interface is made of metallic material.

4. The cooling system for an electronic rack according to claim 1, wherein the first detachable thermal interface or the at least one second detachable thermal interface is a heat pipe.

5. The cooling system for an electronic rack according to claim 1, wherein the electronic rack is provided with no fans therein.

6. The cooling system for an electronic rack according to claim 1, wherein the at least one second detachable thermal interface comprises a first contact portion, a second contact portion and a locking portion, and a displacement of one of the first contact portion and the second contact portion with respect to the other is effected by actuating the locking portion.

7. A cooling system for an electronic rack comprising:
   an electronic rack comprising at least one side wall;
   at least one modular electronic equipment comprising a top wall, at least one side wall, a plurality of electronic components and at least one stationary thermal interface arranged between the upper portions of the plurality of electronic components and the top wall and disposed inside the electronics rack; and
   at least one detachable thermal interface arranged between the at least one side wall of the electronic rack and the at least one side wall of the at least one modular electronic equipment
   wherein the at least one detachable thermal interface comprises a first wedge plate, a second wedge plate and a locking portion, and a displacement of one of the first wedge plate and the second wedge plate with respect to the other is effected by actuating the locking portion.

8. The cooling system for an electronics rack according to claim 7, wherein the at least one detachable thermal interface is made of material with high thermal conductivity.

9. The cooling system for an electronics rack according to claim 7, wherein the at least one detachable thermal interface is made of metallic material.

10. The cooling system for an electronic rack according to claim 7, wherein the at least one detachable thermal interface is a heat pipe.

11. The cooling system for an electronic rack according to claim 7, wherein the electronic rack is provided with no fans therein.

* * * * *